(12) United States Patent
Kraus

(10) Patent No.: US 6,626,835 B1
(45) Date of Patent: Sep. 30, 2003

(54) INFRARED SENSOR STABILIZABLE IN TEMPERATURE, AND INFRARED THERMOMETER WITH A SENSOR OF THIS TYPE

(75) Inventor: Bernhard Kraus, Braunfels (DE)

(73) Assignee: Braun GmbH, Kronberg im Taunus (DE)

( * ) Notice: Subject to any disclaimer, the term of this patent is extended or adjusted under 35 U.S.C. 154(b) by 252 days.

(21) Appl. No.: 09/655,354

(22) Filed: Sep. 5, 2000

(30) Foreign Application Priority Data

Sep. 3, 1999 (DE) .......................... 199 42 214

(51) Int. Cl.[7] ................................ A61B 8/02
(52) U.S. Cl. ............... 600/454; 600/323; 600/339; 600/473; 600/549
(58) Field of Search ................... 600/323, 322, 600/339–341, 310, 344, 473–474, 549, 559

(56) References Cited

U.S. PATENT DOCUMENTS

| | | | |
|---|---|---|---|
| 4,602,642 A | | 7/1986 | O'Hara |
| 4,900,162 A | * | 2/1990 | Beckman et al. ........... 374/132 |
| 4,904,090 A | | 2/1990 | Oliver |
| 4,907,895 A | | 3/1990 | Everest |
| 5,010,315 A | * | 4/1991 | Fedter et al. ................... 338/7 |
| 5,081,358 A | | 1/1992 | Yoshikawa |
| 5,127,742 A | | 7/1992 | Fraden |
| 5,874,736 A | | 2/1999 | Pompei |

FOREIGN PATENT DOCUMENTS

| | | |
|---|---|---|
| DE | 1648179 A | 2/1972 |
| DE | 147 872 | 4/1981 |
| DE | 3709201 A1 | 9/1988 |
| EP | 0 391 128 A1 | 10/1990 |
| EP | 0 566 156 B1 | 10/1993 |
| GB | 2 090 054 A | 6/1982 |
| JP | 3-273121 A | 12/1991 |
| JP | 04335120 A | 11/1992 |
| WO | WO 95/22928 | 8/1995 |
| WO | WO 00/58703 | 10/2000 |

OTHER PUBLICATIONS

European Search Report, dated Jan. 3, 2003, for Application No. EP00117872.2–2217, Applicant Braun GmbH (4 pages).

* cited by examiner

Primary Examiner—Teresa Walberg
Assistant Examiner—Shawntina Fuqua
(74) Attorney, Agent, or Firm—Morgan, Lewis & Bockius LLP

(57) ABSTRACT

The present invention relates to an infrared sensor adapted to be stabilized in temperature and an infrared thermometer with an infrared sensor adapted to be stabilized in temperature, more particularly, a clinical thermometer for temperature measurement in the ear. The infrared sensor has a casing (14) with a window (12) transparent to infrared radiation which are made of materials with a good thermal conduction and are thermally connected to a heating and/or cooling element (16). Further, the infrared sensor includes a temperature sensor (18) which may be identical with the heating and/or cooling element (16).

35 Claims, 3 Drawing Sheets

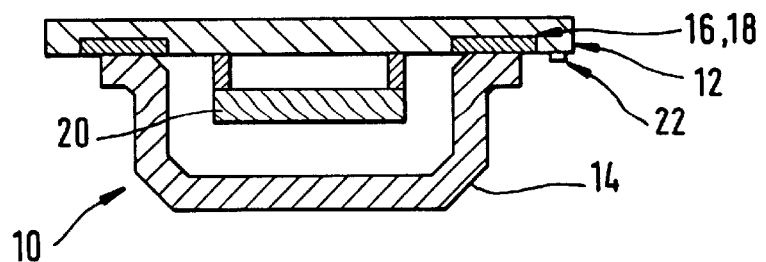
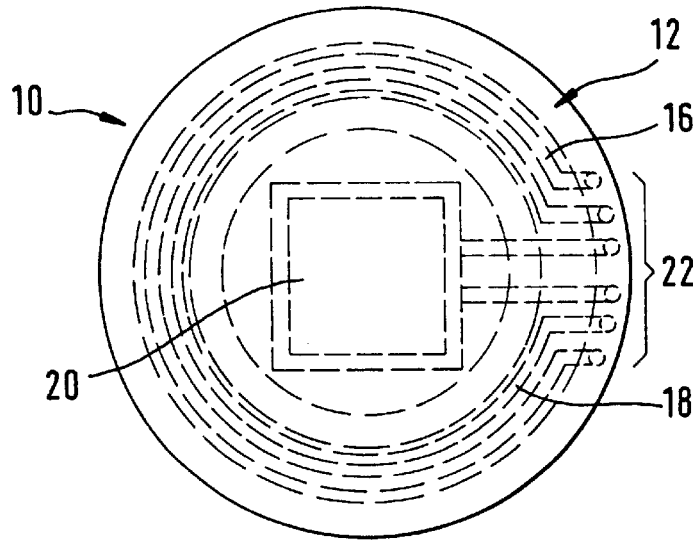
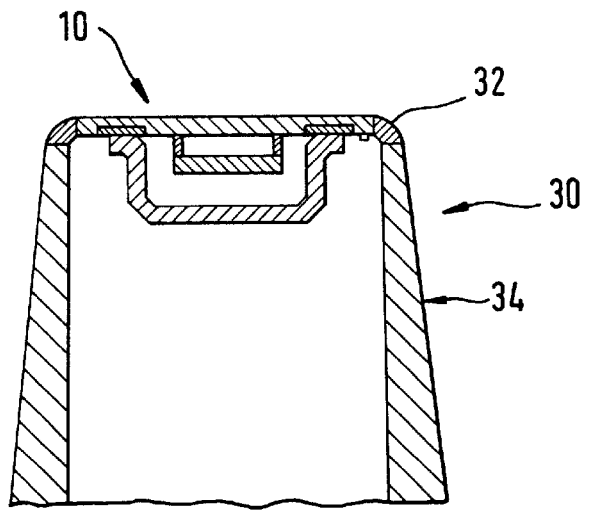

INFRARED SENSOR STABILIZABLE IN TEMPERATURE, AND INFRARED THERMOMETER WITH A SENSOR OF THIS TYPE

The present invention relates to an infrared sensor adapted to be stabilised in temperature and an infrared thermometer with a sensor of this type, in particular, for temperature measurement in the ear.

DE 199 13 672 describes an infrared thermometer with a probe which includes an infrared wave guide and a radiation sensor arranged at the end thereof. The probe and/or a probe cover which is adapted to be mounted onto the probe in a per se known manner are/is so designed that only the front area of the probe or the probe cover can be heated to a temperature which roughly corresponds to the normal temperature in the ear canal. Because the infrared sensor disposed in the probe has an only limited field of view, it is sufficient for minimizing measuring faults that only that part of the probe has the same temperature as the ear canal which enters into thermal interaction with the part of the ear canal that lies in the field of view of the infrared sensor. The relatively small heatable area can be heated in an energy-saving fashion only if it is thermally insulated in relation to the non-heatable part of the probe, however, with the result that the design of the probe becomes more complicated.

GB 2090054 A discloses a radiation detector with a thermistor which is maintained at a constant temperature by two heating elements. The heating elements along with a mounting ring form an envelope which encompasses the thermistor. The envelope is encompassed by a casing having a window transparent to radiation, through which the radiation being detected is admitted into the casing and, through a hole in one of the heating elements, into the envelope and to the thermistor. This radiation detector necessitates a rather sophisticated manufacture and, hence, is quite expensive.

U.S. Pat. No. 5,010,315 discloses a heat radiation sensor element with two NTC resistors, the temperature of which is maintained constant by a respective heating layer. Insulating layers are interposed between the heating layers and the NTC resistors.

DD 147872 discloses a thermopile sensor with a casing that includes a window transparent to radiation. The casing accommodates a sensor element on a support member provided with a central bore which is covered by a membrane. The cold points and the warm points of the sensor element are placed on the membrane, namely the cold points in the area of the support member and the warm points in the area of the bore. Only the warm points are heatable by at least one heating element.

An object of the present invention is to provide a simple heatable and/or coolable infrared sensor and an infrared thermometer of an especially straightforward construction.

An infrared sensor of the present invention includes at least one infrared sensor element, one heating and/or cooling element, and a casing with a window transparent to infrared radiation. The window may e.g. be made of chalcogenit glass which is transparent to infrared radiation and easily formable. The sensor element is arranged in the casing so that infrared light is admitted through the window to the sensor element. The heating/cooling element is connected to the window and/or the casing in a heat-conducting way. It is especially favorable that the casing has such a design as to permit only low temperature gradients inside the casing. Therefore, the heating/cooling element is preferably arranged so that, in the heating or cooling process, the casing and the window will evenly be heated or cooled. To this end, the window and the casing are heat-conductingly interconnected and made of materials having a high degree of thermal conductance, e.g., the casing is made of copper and the window of silicon. There may also be provision of a plurality of heating/cooling elements, one or more of them being arranged on the casing and at least one other being arranged at the window of the infrared sensor. The term "heating/cooling element" e.g. refers to a heating element configured as an NTC or PTC resistor or transistor and, also, a heating and cooling element configured as a Peltier element. Preferably, the heating/cooling element can be heated or cooled electrically.

The heating/cooling element is preferably fitted to the casing of the infrared sensor. It may also consist of a foil, for example, a polyimide foil, to which is applied a conductor-path shaped metal layer, e.g., from aluminum, copper, gold, or a chrome-nickel alloy, or a silver/graphite paste. A heating element which is e.g. made of a conductor-path shaped metal layer or a layer of an electrically conductive plastic material may also be applied directly to the window. In another embodiment of an infrared sensor of the present invention, the window can be heated by a heated filament of constantan, for example, which is passed around the window and has a good heat-conducting connection to it. In a particularly elegant design of an infrared sensor of the present invention, the window is comprised of a semiconductor, especially silicon, in which an electric conductor path made by doping is used as a resistance heating element.

The infrared sensor includes at least one temperature sensor which, preferably, has a heat-conducting connection to the infrared sensor element in a per se known manner. In another embodiment of an infrared sensor of the present invention, the heating/cooling element itself is used as a temperature sensor. When the infrared sensor element is a thermopile, the thermopile itself may serve as a temperature sensor in a way per se known from EP 0 502 277. In this event, the infrared sensor has connections for the infrared sensor element(s) and for the heating element(s). In case the heating element or infrared sensor element is not used as a temperature sensor as well, the infrared sensor additionally has connections for the temperature sensor. The temperature sensor is connectable to a control means by way of its connections.

The control means determines the temperature of the temperature sensor and, thus, of the infrared sensor as well from measurable characteristic magnitudes of the temperature sensor, heating/cooling element, or infrared sensor element, such as the electric resistance, the threshold voltage, or the forward voltage. Preferably, the control means includes for each heating/cooling element a control circuit which, in response to an adjustable nominal temperature value, delivers to the heating element(s) the energy that is respectively required for heating, cooling and/or maintaining the temperature constant. This way, the infrared sensor can be set to a defined temperature and stabilised in temperature. Further, the control means can be connected to an energy source, for example, a battery.

The control means may also be arranged in the infrared sensor which, in this event, apart from the connections for the infrared sensor element(s) includes connections for the input of a nominal temperature value and for connecting to an energy source.

The infrared sensor includes one or more infrared sensor elements, especially thermopiles, as generally disclosed in the relevant prior art. For example, EP 0 566 156 B1 discloses an infrared sensor with two infrared-sensitive elements, one of which is shielded against infrared radiation. A comparison of the signals sent by the two elements permits obtaining a measuring signal which corresponds to the quantity of the incident infrared radiation and is virtually free from electric noise and thermal disturbance. However, the infrared sensor element(s) may also have the design disclosed in DE 197 10 946.

In a preferred embodiment of an infrared sensor of the present invention, a plurality of infrared sensor elements are arranged like a matrix. In this event, the window of the infrared sensor is preferably designed as a lens. The infrared sensor elements are preferably disposed in the focal plane of the lens.

The infrared sensor is arranged directly at the front end of a probe in an infrared thermometer of the present invention. The advantage of this design involves that due to the heatable/coolable infrared sensor practically the entire front end of the probe, or at least the front surface of the probe, may be set to the desired temperature. Therefore, when the probe is introduced into the ear canal, the thermal balance in the ear canal is practically not disturbed, which avoids measuring faults. The probe may have a per se known shape or a per se known design; especially, it may be flexible. As an example for a probe of this type EP 0 588 631 A2 is referred to which describes a flexible probe having its flexibility increased by a slot or bellows provided on its outside periphery. Further, the probe may have ribs, indentations, or the like, on its outside.

Further features and advantages of the present invention can be taken from the following description of preferred embodiments for infrared sensors and infrared thermometers of the present invention as shown in the accompanying drawings. In the drawings, like components have been assigned like reference numerals. In a schematic illustration in the drawings, FIG. 1 is a cross-sectional view of a first embodiment of an infrared sensor of the present invention.

FIG. 2 is a top view of the infrared sensor of FIG. 1.

FIG. 3 shows a first probe of an infrared thermometer with the infrared sensor of FIG. 2.

Figure 4:
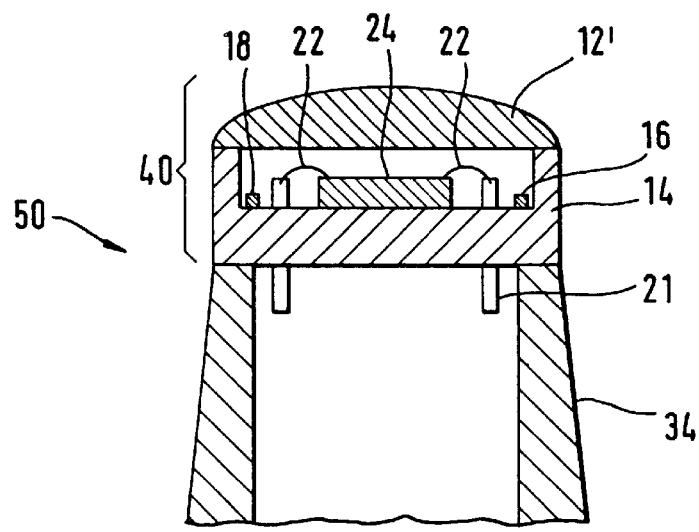
FIG. 4 is a second embodiment of an infrared sensor of the present invention which is arranged at the front of a second probe of an infrared thermometer.

The embodiment of FIG. 1 shows a first infrared sensor 10 according to the present invention with a casing 14 including a window 12 transparent to infrared radiation. Window 12 is preferably made of silicon. A heating element 16 and a temperature sensor 18 are designed in window 12. An infrared sensor element 20 for converting the sensed infrared radiation into an electric output signal is attached to window 12 inside the casing 14. Two connections 22 at the edge of window 12 are respectively provided for the output signal of the infrared sensor element 20 and of the temperature sensor 18 as well as the current supply of the heating element 16. The output signals of the infrared sensor element 20 and the temperature sensor 18 may be evaluated by means of an electronic measuring system (not shown in the Figure), and a radiation temperature measured may be indicated on a display (not shown in the Figure).

As shown in the embodiment of FIG. 2, the window 12 has the shape of a pane. The heating element 16 has the shape of a conductor path and is arranged annularly at the edge of the window 12. Temperature sensor 18 also has the shape of a conductor path and extends farther inwards in parallel to the heating element 16. The proximity of the heating element 16 to the temperature sensor 18 allows controlling the temperature of the infrared sensor 10 very accurately and with low inertia. The infrared sensor element 20, which is preferably one or a plurality of thermopiles, is positioned in the middle of window 12.

The first probe 30 of an infrared thermometer, as illustrated schematically in FIG. 3, includes at its front end the infrared sensor 10 as shown in FIGS. 1 and 2. Sensor 10 is fixed to its window 12 by means of a metal ring 32. This metal ring is attached to a stem 34, that is preferably made of plastics, said's outside shape and dimensions being adapted to the human ear canal.

The embodiment of FIG. 4 shows a second probe 50 of an infrared thermometer of the present invention, wherein a second infrared sensor 40 of the present invention is seated directly on the stem 34 so that the entire front end of the probe 50 is formed by the infrared sensor 40 and is adapted to be heated or cooled. Sensor 40 includes an outwards curved window 12' which pictures incident infrared radiation on a preferably matrix-type assembly 24 made of several infrared sensor elements. The heating/cooling element 16, the temperature sensor 18, and the infrared sensor elements are arranged inside on the bottom of the casing 14 of the infrared sensor 40. They may also be fitted to a foil (not shown), with the assembly 24 of infrared sensor elements being preferably disposed on the top side of the foil, while on the bottom side of the foil at least one heating/cooling element is arranged and, if necessary, a temperature sensor in the form of one or more conductor paths which afford a good heat conduction with the bottom of the casing. The connections 22 of the assembly 24 of infrared sensor elements are illustrated only schematically; they are led outwards by way of connecting pins 21.

Figure 5:
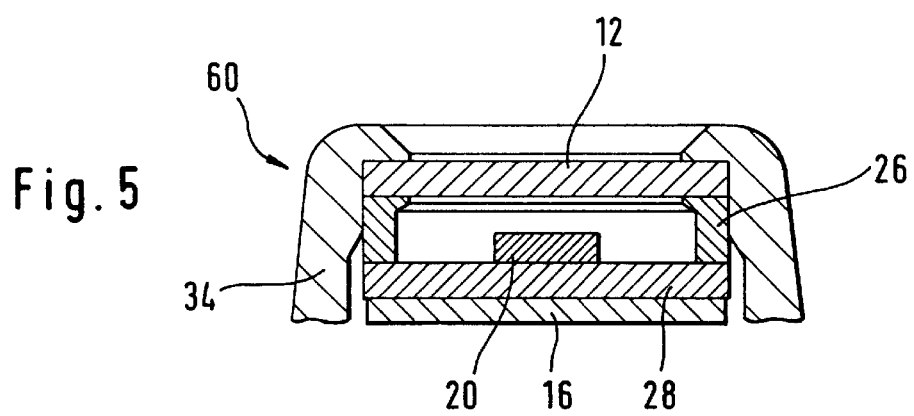
FIG. 5 is a third embodiment of an infrared sensor of the present invention which is arranged at the front of a third probe of an infrared thermometer.

The embodiment of FIG. 5 shows a third probe 60 of an infrared thermometer of the present invention with a third infrared sensor according to the invention. The probe includes a stem 34 in which the infrared sensor is mounted so that the lateral walls 26 of the infrared sensor and the outer edge of window 12 are encompasssed by stem 34. An infrared sensor element 20 or an assembly of several infrared sensor elements is arranged opposite the window 12 at the casing bottom 28 of the infrared sensor. The infrared sensor element is preferably comprised of a thermopile. A temperature sensor (not shown in FIG. 5) is arranged proximate the cold points of the thermopile in a per se known manner. Fitted likewise on the casing bottom 28, however, outside the casing of the infrared sensor, is a heating and/or cooling element 16.

Figure 6:
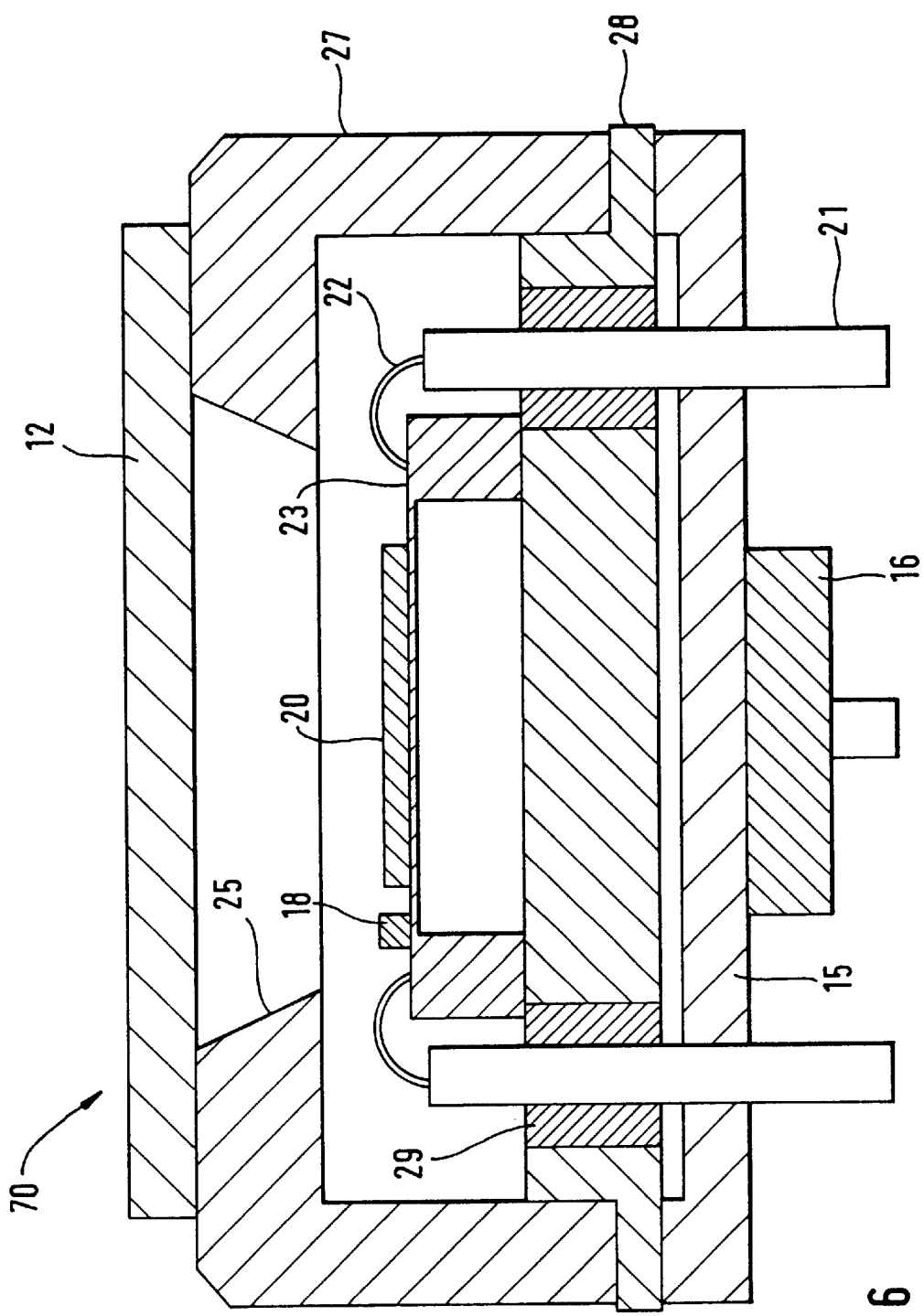
FIG. 6 is a cross-sectional view of a fourth embodiment of an infrared sensor of the present invention.

The embodiment of FIG. 6 shows a fourth infrared sensor 70 according to the present invention which includes a casing top 27, a window 12 transparent to infrared radiation, and a casing bottom 28. An infrared sensor element 20, or an assembly of several infrared sensor elements, and a temperature sensor 18 is attached to a frame 23 inside the casing. The connections 22 of the infrared sensor element 20 and the temperature sensor 18 are shown only schematically and, by way of connecting pins 21, they extend to the outside through ducts 29 in the casing bottom 28. The heating/cooling element 16 is mounted on a heat distribution plate 15 which is attached in a heat-conducting fashion on the outside of the casing bottom 28. However, plate 15 may also be fitted to the casing at any other location. The casing top 27 includes an opening which is closed by window 12. The lateral walls 25 of the opening are chamfered so that infrared radiation which enters through window 12 is reflected in the direction of the infrared sensor element 20.

The features of an infrared sensor or infrared thermometer which have been described in connection with one of the embodiments disclosed may be implemented accordingly in any of the other embodiments.

What is claimed is:

1. An infrared sensor, comprising at least one infrared sensor element (20; 24), at least one heating and/or cooling element (16), and a casing (14; 26, 27, 28) which includes a window (12) that is transparent to infrared radiation, wherein the heating/cooling element (16) is in a heat-conducting connection to at least one of the window (12) and the casing (14; 26, 27, 28) so as to keep the window and casing at a nearly uniform temperature.

2. The infrared sensor as claimed in claim 1, characterized in that the sensor includes at least one temperature sensor (18) which is in a heat-conducting connection to at least one of the sensor element (20) and the window (12) and the casing (14; 26, 27, 28).

3. The infrared sensor as claimed in claim 2, characterized in that the heating/cooling element (16) or the infrared sensor element (20) can be used as a temperature sensor (18).

4. The infrared sensor as claimed in claim 3, characterized in that the window (12) is a semiconductor, and in that the heating element (16) and/or the temperature sensor (18) in the window is formed by doping an area shaped like a conductor path.

5. The infrared sensor as claimed in claim 3, characterized in that at least one of the heating and cooling element (16) and the temperature sensor (18) is comprised of a conductor path or paste applied to a foil.

6. The infrared sensor as claimed in claim 3, characterized in that at least one of the heating and the cooling element (16) is in a heat-conducting connection to a heat distribution plate (15), and the heat distribution plate (15) is in a heat-conducting connection to the casing.

7. The infrared sensor as claimed in claim 2, characterized in that at least one of the heating and cooling element (16) and the temperature sensor (18) is comprised of a conductor path or paste applied to a foil.

8. The infrared sensor as claimed in claim 7, characterized in that the sensor elements (20) are arranged on the top side of a foil, and wherein at least one of the heating/cooling element (16) and the temperature sensor (18) is arranged on the bottom side of the foil.

9. The infrared sensor as claimed in claim 2, characterized in that at least one of the heating and the cooling element (16) is in a heat-conducting connection to a heat distribution plate (15), and the heat distribution plate (15) is in a heat-conducting connection to the casing.

10. The infrared sensor as claimed in claim 2, characterized in that the window (12) is a semiconductor, and in that the heating element (16) and/or the temperature sensor (18) in the window is formed by doping an area shaped like a conductor path.

11. The infrared sensor as claimed in claim 1, characterized in that at least one of the heating and the cooling element (16) is in a heat-conducting connection to a heat distribution plate (15), and the heat distribution plate (15) is in a heat-conducting connection to the casing.

12. The infrared sensor as claimed in claim 1, characterized in that the window (12) and the casing (14; 26, 27, 28) are interconnected in a heat-conducting fashion and are made of materials with a high thermal conductance.

13. The infrared sensor as claimed in claim 1, characterized in that the window (12) is designed as a lens.

14. The infrared sensor as claimed in claim 13, characterized in that the infrared sensor element (20) or the infrared sensor elements of the assembly (24) is comprised of at least one thermopile.

15. The infrared sensor as claimed in claim 1, characterized in that a casing top (27) of the infrared sensor has an opening whose lateral walls (25) are chamfered.

16. The infrared sensor as claimed in claim 15, characterized in that the infrared sensor element (20) or the infrared sensor elements of the assembly (24) is comprised of at least one thermopile.

17. An infrared thermometer for the temperature measurement in the ear, which includes a probe and an infrared sensor as claimed in any one of claims 1, 2, 3, 4, 5, 6, 7, 8, 9, 10, 11, 12, 13, 14, 15 or 16 that is arranged at the front end of the probe.

18. The infrared thermometer as claimed in claim 17, characterized in that the thermometer or the sensor includes a control means for controlling the heating/cooling capacity of at least one of the heating and the cooling element (16).

19. The infrared thermometer or infrared sensor as claimed in claim 18, chacterized in that the control means permits determining the temperature of the infrared sensor by measurement of defined characteristic magnitudes of at least one of the heating/cooling element (16), the infrared sensor element (20), and the temperature sensor (18).

20. The infrared sensor as claimed in claim 16, characterized in that the probe is flexible.

21. An infrared thermometer for the temperature measurement in the ear, which includes a probe and an infrared sensor, said sensor arranged at the front end of the probe and comprising at least one infrared sensor element (20; 24), at least one heating and/or cooling element (16), and a casing (14; 26, 27, 28) which includes a window (12) that is transparent to infrared radiation, wherein the heating/cooling element (16) is in a heat-conducting connection to at least one of the window (12) and the casing (14; 26, 27, 28).

22. The infrared thermometer as claimed in claim 21 characterized in that the sensor includes at least one temperature sensor (18) which is in a heat-conducting connection to at least one of the sensor element (20) and the window (12), and the casing (14; 26, 27, 28).

23. The infrared thermometer as claimed in claim 22, characterized in that the heating/cooling element (16) or the infrared sensor element (20) can be used as a temperature sensor (18).

24. The infrared sensor as claimed in claim 23, characterized in that the window (12) is a semiconductor, and in that the heating element (16) and/or the temperature sensor (18) in the window is formed by doping an area shaped like a conductor path.

25. The infrared sensor as claimed in claim 23, characterized in that at least one of the heating and cooling element (16) and the temperature sensor (18) is comprised of a conductor path or paste applied to a foil.

26. The infrared sensor as claimed in claim 23, characterized in that at least one of the heating and the cooling element (16) is in a heat-conducting connection to a heat distribution plate (15), and the heat distribution plate (15) is in a heat-conducting connection to the casing.

27. The infrared thermometer as claimed in claim 22, characterized in that the window (12) is a semiconductor, and in that the heating element (16) and/or the temperature sensor (18) in the window is formed by doping an area shaped like a conductor path.

28. The infrared thermometer as claimed in claim 22, characterized in that at least one of the heating and cooling element (16) and the temperature sensor (18) is comprised of a conductor path or paste applied to a foil.

29. The infrared thermometer as claimed in claim 28, characterized in that the sensor elements (20) are arranged on the top side of a foil, and wherein at least one of the heating/cooling element (16) and the temperature sensor (18) is arranged on the bottom side of the foil.

30. The infrared sensor as claimed in claim 22, characterized in that at least one of the heating and the cooling element (16) is in a heat-conducting connection to a heat distribution plate (15), and the heat distribution plate (15) is in a heat-conducting connection to the casing.

31. The infrared thermometer as claimed in claim 21, characterized in that at least one of the heating and the cooling element (16) is in a heat-conducting connection to a heat distribution plate (15), and the heat distribution plate (15) is in a heat-conducting connection to the casing.

32. The infrared thermometer as claimed in claim 21, characterized in that the window (12) and the casing (14; 26, 27, 28) are interconnected in a heat-conducting fashion and are made of materials with a high thermal conductance.

33. The infrared thermometer as claimed in claim 21, characterized in that the window (12) is designed as a lens.

34. The infrared thermometer as claimed in claim 33, characterized in that the infrared sensor element (20) or the infrared sensor elements of the assembly (24) is comprised of at least one thermopile.

35. The infrared thermometer as claimed in claim 21, characterized in that a casing top (27) of the infrared sensor has an opening whose lateral walls (25) are chamfered.

* * * * *